(12) United States Patent
Suich et al.

(10) Patent No.: US 11,837,684 B2
(45) Date of Patent: Dec. 5, 2023

(54) SUBMOUNT STRUCTURES FOR LIGHT EMITTING DIODE PACKAGES

(71) Applicant: CreeLED, Inc., Durham, NC (US)

(72) Inventors: David Suich, Durham, NC (US); Daniel E. Stasiw, Durham, NC (US); Samuel Richard Harrell, Jr., Cary, NC (US)

(73) Assignee: CreeLED, Inc., Durham, NC (US)

( * ) Notice: Subject to any disclaimer, the term of this patent is extended or adjusted under 35 U.S.C. 154(b) by 0 days.

(21) Appl. No.: 16/690,707

(22) Filed: Nov. 21, 2019

(65) Prior Publication Data

US 2021/0159368 A1 May 27, 2021

(51) Int. Cl.
  *H01L 33/48* (2010.01)
  *H01L 33/50* (2010.01)
  *H01L 33/62* (2010.01)

(52) U.S. Cl.
  CPC .......... *H01L 33/486* (2013.01); *H01L 33/505* (2013.01); *H01L 33/62* (2013.01)

(58) Field of Classification Search
  None
  See application file for complete search history.

(56) References Cited

U.S. PATENT DOCUMENTS

| | | | |
|---|---|---|---|
| 8,455,908 B2 | 6/2013 | Welch et al. | |
| 9,012,938 B2 | 4/2015 | Yuan et al. | |
| 9,105,824 B2 | 8/2015 | Heikman et al. | |
| 9,431,585 B2 * | 8/2016 | Camras | H01L 33/28 |
| 10,121,947 B2 * | 11/2018 | Palaniswamy | B32B 27/281 |
| 10,186,639 B2 * | 1/2019 | Lim | H01L 33/44 |
| 10,290,777 B2 | 5/2019 | Andrews et al. | |
| 2004/0222433 A1 * | 11/2004 | Mazzochette | H01L 25/0753 257/E33.059 |

(Continued)

FOREIGN PATENT DOCUMENTS

| | | |
|---|---|---|
| JP | 2006278730 A | 10/2006 |
| JP | 2013143410 A | 7/2013 |

OTHER PUBLICATIONS

International Search Report and Written Opinion for International Patent Application No. PCT/US2020/061249, dated Mar. 11, 2021, 16 pages.

*Primary Examiner* — Bilkis Jahan
(74) *Attorney, Agent, or Firm* — Withrow & Terranova, P.L.L.C.

(57) ABSTRACT

Submount structures for light-emitting diode (LED) packages are provided. Submounts may include a base material that is configured to provide high thermal conductivity and a ceramic layer on the base material that is configured to provide high reflectivity for one or more LED chips that are mounted thereon. In certain aspects, the base material may include a ceramic base having a ceramic material that is different than a material of the ceramic layer. In certain aspects, submounts may also include additional ceramic layers configured to provide high reflectivity. In certain aspects, LED packages include electrical traces that are arranged either on one or more ceramic layers or at least partially embedded within one or more ceramic layers. The arrangement of such ceramic layers may provide increased reflectivity in areas where it may be difficult for other reflective materials to be present, such as gaps formed between tightly spaced electrical traces.

26 Claims, 9 Drawing Sheets

(56) References Cited

U.S. PATENT DOCUMENTS

| | | | |
|---|---|---|---|
| 2009/0101897 A1* | 4/2009 | Murphy | H01L 23/60 257/48 |
| 2011/0127568 A1* | 6/2011 | Donofrio | H01L 33/486 257/99 |
| 2011/0260199 A1 | 10/2011 | Andrews | |
| 2011/0266570 A1 | 11/2011 | Hsieh et al. | |
| 2013/0279169 A1* | 10/2013 | Reiherzer | H01L 24/32 362/249.02 |
| 2014/0001497 A1* | 1/2014 | Jagt | H01L 33/62 257/88 |
| 2014/0239325 A1 | 8/2014 | Andrews et al. | |
| 2016/0308101 A1* | 10/2016 | Konishi | H01L 33/62 |
| 2017/0018697 A1 | 1/2017 | Konishi et al. | |
| 2017/0148718 A1* | 5/2017 | Morita | H01L 23/49805 |
| 2019/0304960 A1* | 10/2019 | Ko | H01L 24/08 |
| 2019/0363223 A1 | 11/2019 | Murthy et al. | |
| 2019/0363232 A1 | 11/2019 | Murthy et al. | |
| 2020/0075495 A1* | 3/2020 | Takeshita | H01L 23/04 |
| 2020/0075813 A1 | 3/2020 | Joo et al. | |

* cited by examiner

SUBMOUNT STRUCTURES FOR LIGHT EMITTING DIODE PACKAGES

FIELD OF THE DISCLOSURE

The present disclosure relates to solid-state lighting devices including light-emitting diodes (LEDs), and more particularly to packaged LED devices.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions.

Typically, it is desirable to operate LEDs at the highest light emission efficiency possible, which can be measured by the emission intensity in relation to the output power (e.g., in lumens per watt). A practical goal to enhance emission efficiency is to maximize extraction of light emitted by the active region in the direction of the desired transmission of light. Light extraction and external quantum efficiency of an LED can be limited by a number of factors, including internal reflection. According to the well-understood implications of Snell's law, photons reaching the surface (interface) between an LED surface and the surrounding environment are either refracted or internally reflected. If photons are internally reflected in a repeated manner, then such photons eventually are absorbed and never provide visible light that exits an LED.

The art continues to seek improved light-emitting diodes and solid-state lighting devices having desirable illumination characteristics capable of overcoming challenges associated with conventional lighting devices.

SUMMARY

Aspects disclosed herein relate to submount structures for light-emitting diode (LED) packages. Submounts may include a base material that is configured to provide high thermal conductivity and a ceramic layer on the base material that is configured to provide high reflectivity for one or more LED chips that are mounted thereon. In certain aspects, the base material may include a ceramic base having a ceramic material that is different than a material of the ceramic layer. In certain aspects, submounts may also include additional ceramic layers configured to provide high reflectivity. In certain aspects, LED packages include electrical traces that are arranged either on one or more ceramic layers or at least partially embedded within one or more ceramic layers. The arrangement of such ceramic layers may provide increased reflectivity in areas where it may be difficult for other reflective materials to be present, such as gaps formed between tightly spaced electrical traces.

In one aspect, an LED package comprises: a submount comprising a ceramic base and a ceramic layer that is arranged on the ceramic base, wherein the ceramic base comprises a first ceramic material and the ceramic layer comprises a second ceramic material that is different than the first ceramic material; one or more electrical traces on the ceramic layer; and at least one LED chip that is electrically connected to the one or more electrical traces. In certain embodiments, the first ceramic material comprises aluminum nitride. In certain embodiments, the second ceramic material comprises alumina. In certain embodiments, the second ceramic material comprises zirconia toughened alumina. In certain embodiments, the second ceramic material comprises an oxidized layer of titanium.

In certain embodiments, a thickness of the ceramic layer is 10% or less than a thickness of the ceramic base. In certain embodiments, a thickness of the ceramic layer is 3% or less than a thickness of the ceramic base. In certain embodiments, a thermal conductivity of the ceramic base is at least 100 watts per meter-kelvin (W/mK) and a thermal conductivity of the ceramic layer is 50 W/mK or less.

In certain embodiments, the LED package further comprises one or more additional ceramic layers that are arranged between the one or more electrical traces and the ceramic base. In certain embodiments, the LED package further comprises a light-altering material on the ceramic layer, wherein the light-altering material is arranged around a perimeter of the at least one LED chip. In certain embodiments, the LED package further comprises a wavelength conversion element on the at least one LED chip, wherein the light-altering material is arranged around a perimeter of the wavelength conversion element. In certain embodiments, one or more electrically conductive paths are arranged through the ceramic layer and the ceramic base to electrically connect the at least one LED chip to one or more package contacts that are arranged on a backside of the submount.

In another aspect, an LED package comprises: a submount comprising a ceramic base and a ceramic layer that is arranged on the ceramic base, wherein the ceramic base comprises a first ceramic material and the ceramic layer comprises a second ceramic material that is different than the first ceramic material; one or more electrical traces at least partially embedded in the ceramic layer; and at least one LED chip that is electrically connected to the one or more electrical traces. In certain embodiments, the one or more electrical traces form an anode electrical trace and a cathode electrical trace for the at least one LED chip. In certain embodiments, the anode electrical trace and the cathode electrical trace are laterally spaced from each other by a gap of no more than 25 microns. In certain embodiments, the gap comprises a portion of the ceramic layer.

In certain embodiments, the first ceramic material comprises aluminum nitride and the second ceramic material comprises alumina. In certain embodiments, the first ceramic material comprises aluminum nitride and the second ceramic material comprises zirconia toughened alumina. In certain embodiments, the first ceramic material comprises aluminum nitride and the second ceramic material comprises an oxidized layer of titanium.

In certain embodiments, the one or more electrical traces are at least partially embedded in one or more additional ceramic layers.

In another aspect, an LED package comprises: a submount comprising a base material and an oxidized layer of titanium that is arranged on the base material; one or more electrical traces on the submount; and at least one LED chip that is electrically connected to the one or more electrical traces. In certain embodiments, the base material comprises a ceramic base. In certain embodiments, the ceramic base comprises aluminum nitride. In certain embodiments, the base material comprises silicon. In certain embodiments, the one or more electrical traces are on the oxidized layer of titanium. In certain embodiments, the one or more electrical traces are at least partially embedded in the oxidized layer of titanium.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS FIGURES

The accompanying drawing figures incorporated in and forming a part of this specification illustrate several aspects of the disclosure, and together with the description serve to explain the principles of the disclosure.

DETAILED DESCRIPTION

Figure 1:
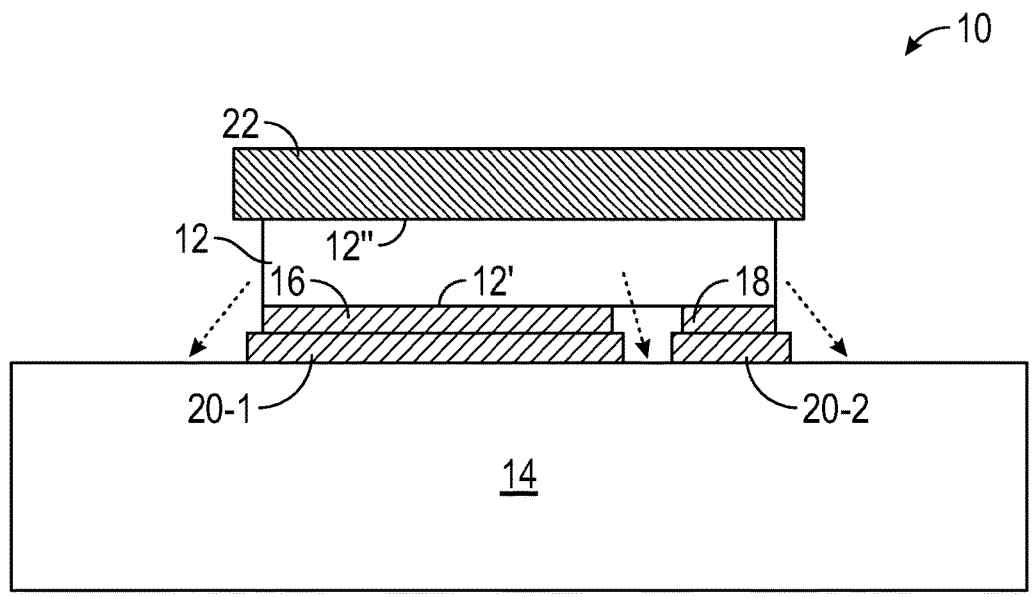
FIG. 1 is a cross-sectional illustration of a light-emitting diode (LED) package that includes an LED chip mounted on a submount.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed herein relate to submount structures for light-emitting diode (LED) packages. Submounts may include a base material that is configured to provide high thermal conductivity and a ceramic layer on the base material that is configured to provide high reflectivity for one or more LED chips that are mounted thereon. In certain aspects, the base may include a ceramic base having a ceramic material that is different than a material of the ceramic layer. In certain aspects, submounts may also include additional ceramic layers configured to provide high reflectivity. In certain aspects, LED packages include electrical traces that are arranged either on one or more ceramic layers or at least partially embedded within one or more ceramic layers. The arrangement of such ceramic layers may provide increased reflectivity in areas where it may be difficult for other reflective materials to be present, such as gaps formed between tightly spaced electrical traces.

An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition (MOCVD). The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including but not limited to, buffer layers, nucleation layers, super lattice structures, undoped layers, cladding layers, contact layers, current-spreading layers, and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), and GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light transmissive optical properties.

Different embodiments of the active LED structure can emit different wavelengths of light depending on the composition of the active layer and n-type and p-type layers. For example, the active LED structure for various LEDs may emit blue light with a peak wavelength range of approximately 430 nanometers (nm) to 480 nm, green light with a peak wavelength range of 500 nm to 570 nm, or red or red-orange light with a peak wavelength range of 600 nm to 650 nm. In certain embodiments, red light may include a peak wavelength range of 600 nm to 700 nm, or 650 nm to 700 nm depending on the application. The LED chip can also be covered with one or more lumiphoric materials or other conversion materials, such as phosphors, such that at least some of the light from the LED chip is absorbed by the one or more phosphors and is converted to one or more different wavelength spectra according to the characteristic emission from the one or more phosphors. In certain embodiments, the combination of the LED chip and the one or more phosphors emits a generally white combination of light. The one or more phosphors may include yellow (e.g., YAG:Ce), green (e.g., LuAg:Ce), and red (e.g., $Ca_{i-x-y}Sr_x Eu_y AlSiN_3$) emitting phosphors, and combinations thereof.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips.

In certain embodiments, one or more lumiphoric materials may be provided as at least a portion of a wavelength conversion element. Wavelength conversion elements may include a support element, such as a superstrate, and one or more lumiphoric materials that are provided by any suitable means, such as by coating a surface of the superstrate or by incorporating within the superstrate. The term "superstrate" as used herein refers to an element placed on or over an LED chip that includes a lumiphoric material. The term "superstrate" is used herein, in part, to avoid confusion with other substrates that may be part of the semiconductor light emitting device, such as a growth or carrier substrate of the LED chip or a submount of an LED package. The term "superstrate" is not intended to limit the orientation, location, and/or composition of the structure it describes. In some embodiments, the superstrate may be composed of, for example, sapphire, SiC, silicone, and/or glass (e.g., borosilicate and/or fused quartz). Superstrates may be patterned to enhance light extraction as described in commonly-assigned U.S. Provisional Application No. 62/661,359 entitled "Semiconductor Light Emitting Devices Including Superstrates With Patterned Surfaces", the subject matter of which was later filed in U.S. patent application Ser. No. 16/390,714, filed Apr. 22, 2019, now U.S. Pat. No. 11,309,462, which are hereby incorporated by reference herein. Superstrates may also be configured as described in commonly-assigned U.S. Patent Application Publication No. 2018/0033924, also incorporated by reference herein. Superstrates may be formed from a bulk substrate which is optionally patterned and then singulated. In certain embodiments, the patterning of a superstrate may be performed by an etching process (e.g., wet or dry etching). In certain embodiments, the patterning of a superstrate may be performed by otherwise altering the surface, such as by a laser or saw. In certain embodiments, the superstrate may be thinned before or after the patterning process is performed. In certain embodiments, superstrates may comprise a generally planar upper surface that corresponds to a light emission area of the LED package.

One or more lumiphoric materials may be arranged on the superstrate by, for example, spraying and/or otherwise coating the superstrate with the lumiphoric materials. Wavelength conversion elements may be attached to one or more LED chips using, for example, a layer of transparent adhesive. In certain embodiments, the layer of the transparent adhesive may include silicone with a refractive index in a range of about 1.3 to about 1.6 that is less than a refractive index of the LED chip on which the wavelength conversion element is placed. In other embodiments, wavelength conversion elements may comprise alternative configurations, such as phosphor-in-glass or ceramic phosphor plate arrangements. Phosphor-in-glass or ceramic phosphor plate arrangements may be formed by mixing phosphor particles with glass frit or ceramic materials, pressing the mixture into planar shapes, and firing or sintering the mixture to form a hardened structure that can be cut or separated into individual wavelength conversion elements.

Light emitted by the active layer or region of the LED chip typically has a lambertian emission pattern. For directional applications, internal mirrors or external reflective surfaces may be employed to redirect as much light as possible toward a desired emission direction. Internal mirrors may include single or multiple layers. Some multi-layer mirrors include a metal reflector layer and a dielectric reflector layer, wherein the dielectric reflector layer is arranged between the metal reflector layer and a plurality of semiconductor layers. A passivation layer may be arranged between the metal reflector layer and first and second electrical contacts, wherein the first electrical contact is arranged in conductive electrical communication with a first semiconductor layer, and the second electrical contact is arranged in conductive electrical communication with a second semiconductor layer. In certain embodiments, the first and second electrical contacts themselves may be configured as mirror layers. For single or multi-layer mirrors including surfaces exhibiting less than 100% reflectivity, some light may be absorbed by the mirror. Additionally, light that is redirected through the active LED structure may be absorbed by other layers or elements within the LED chip. External reflective surfaces may include one or more reflective surfaces of LED packages, lighting fixtures, and lighting housings.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In certain embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (for example, at least 80% reflective) may be considered a reflective material. In the case of ultraviolet (UV) LEDs, appropriate materials may be selected to provide a desired, and in certain embodiments high, reflectivity, and/or a desired, and in certain embodiments low, absorption. In certain embodiments, a "light-transmissive" material may be configured to transmit at least 50% of emitted radiation of a desired wavelength. In certain embodiments, an initially "light-transmissive" material may be altered to be a "light-absorbing material" that transmits less than 50% of emitted radiation of a desired wavelength with the addition of one or more light-absorbing materials, such as opaque or non-reflective materials including grey, dark, or black particles or materials.

In certain embodiments, light-altering materials are provided on one or more surfaces of a submount. The light-altering material may be adapted for dispensing, or placing, and may include many different materials including light-reflective materials that reflect or redirect light, light-absorbing materials that absorb light, and materials that act as a thixotropic agent. As used herein, the term "light-reflective" refers to materials or particles that reflect, refract, or otherwise redirect light. For light-reflective materials, the light-altering material may include at least one of fused silica, fumed silica, titanium dioxide ($TiO_2$), or metal particles suspended in a binder, such as silicone or epoxy. In certain embodiments, the light-altering material may comprise a white solder mask material or a white paint material. For light-absorbing materials, the light-altering material may include at least one of carbon, silicon, or metal particles suspended in a binder, such as silicone or epoxy. The light-reflective materials and the light-absorbing materials may comprise nanoparticles.

In certain embodiments, the light-altering material includes both light-reflective material and light-absorbing material suspended in a binder. A weight ratio of the light-reflective material to the binder may comprise a range of about 1:1 to about 2:1. A weight ratio of the light-absorbing material to the binder may comprise a range of about 1:400 to about 1:10. In certain embodiments, a total weight of the light-altering material includes any combination of the binder, the light-reflective material, and the light-absorbing material. In some embodiments, the binder may comprise a weight percent that is in a range of about 10% to about 90% of the total weight of the light-altering material. The light-reflective material may comprise a weight percent that is in a range of about 10% to about 90% of the total weight of the light-altering material. The light-absorbing material may comprise a weight percent that is in a range of about 0% to about 15% of the total weight of the light-altering material.

In further embodiments, the light-absorbing material may comprise a weight percent that is in a range of about greater than 0% to about 15% of the total weight of the light-altering material. In further embodiments, the binder may comprise a weight percent that is in a range of about 25% to about 70% of the total weight of the light-altering material. The light-reflective material may comprise a weight percent that is in a range of about 25% to about 70% of the total weight of the light-altering material. The light-absorbing material may comprise a weight percent that is in a range of about 0% to about 5% of the total weight of the light-altering material. In further embodiments, the light-absorbing material may comprise a weight percent that is in a range of about greater than 0% to about 5% of the total weight of the light-altering material.

In certain embodiments, the light-altering material may comprise a generally white color to reflect and redirect light. In other embodiments, the light-altering material may comprise a generally opaque or black color for absorbing light and increasing contrast of an LED package. The light-altering material can be dispensed or deposited in place using an automated dispensing machine where any suitable size and/or shape can be formed. The light-altering material may have a viscosity configured to be dispensed around a perimeter of an LED chip and surface tension will keep the light-altering material off of a primary emitting surface of the LED chip. Additionally, the light-altering material may wick in between adjacent LED chips that are separated by narrow lateral distances.

The present disclosure can be useful for LED chips having a variety of geometries, such as vertical geometry or lateral geometry. A vertical geometry LED chip typically includes anode and cathode connections on opposing sides or faces of the LED chip. A lateral geometry LED chip typically includes both anode and cathode connections on the same side or face of the LED chip that is opposite a substrate, such as a growth substrate. In an LED package, a lateral geometry LED chip may be mounted on a submount of the LED package such that the anode and cathode are on a face of the active LED structure that is opposite the submount. In this arrangement, wirebonds may be used to provide electrical connections with the anode and cathode. Certain embodiments disclosed herein relate to the use of flip chip LED devices in which a light transmissive substrate represents an exposed light-emitting surface. In such arrangements, the anodes and cathodes of LED chips that are flip-chip mounted may be mounted or bonded to electrical traces or patterns on the submount of the corresponding LED package. LED packages as disclosed herein may include arrangements that include one or more of submounts, electrical connections, light-altering materials, reflective materials, encapsulants, lenses, optics, and lumiphoric materials on or supporting one or more LED chips.

In certain embodiments, LED packages may include various arrangements of LED chips on submounts. The submount can be formed of many different materials with an exemplary material being electrically insulating. Suitable materials include, but are not limited to ceramic materials such as aluminum oxide or alumina, AlN, or organic insulators like polyimide (PI) and polyphthalamide (PPA). In other embodiments, the submount can comprise a printed circuit board (PCB), sapphire, Si or any other suitable material. For PCB embodiments, different PCB types can be used such as a standard FR-4 PCB, a metal core PCB, or any other type of PCB.

In certain embodiments, metal or electrical traces may be arranged on a major face of a submount for providing electrical connections to one or more LED chips. Electrical traces may include any number of electrically conductive materials, such as at least one of the following: copper (Cu) or alloys thereof, nickel (Ni) or alloys thereof, nickel chromium (NiCr), gold (Au) or alloys thereof, electroless Au, electroless silver (Ag), NiAg, Al or alloys thereof, titanium tungsten (TiW), titanium tungsten nitride (TiWN), electroless nickel electroless palladium immersion gold (ENEPIG), electroless nickel immersion gold (ENIG), hot air solder leveling (HASL), and organic solderability preservative (OSP). In certain embodiments, electrical traces may include a first layer of Cu or Ni followed by a layer of ENEPIG or ENIG that conformally covers a top and sidewalls of the first layer of Cu or Ni. In certain embodiments, electrical connections between LED chips and electrical traces may be provided with or without a number of wirebonds.

Embodiments of the disclosure are described herein with reference to cross-sectional view illustrations that are schematic illustrations of embodiments of the disclosure. As such, the actual thickness of the layers can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Common elements between figures may be shown herein with common element numbers and may not be subsequently re-described.

FIG. 1 is a cross-sectional illustration of an LED package 10 that includes an LED chip 12 mounted on a submount 14. The LED chip 12 includes a mounting face 12' and a primary light emitting face 12". In FIG. 1, the LED chip 12 is arranged on the submount 14 in a flip-chip configuration such that the mounting face 12' is arranged closer to the submount 14. The LED chip 12 may include a first contact pad 16 and a second contact pad 18 that are provided on the mounting face 12' and configured to be mounted and electrically connected to a plurality of electrical traces 20-1, 20-2 that are arranged on the submount 14. The first contact pad 16 and the second contact pad 18 may comprise different ones of an anode contact pad and a cathode contact pad for the LED chip 12. Depending on the configuration, a lumiphoric material 22 may be arranged on the primary light emitting face 12″ of the LED chip 12. In operation, light generated by the LED chip 12 or light that interacts with the lumiphoric material 22 may be oriented in an omnidirectional manner. Any light that reaches the submount 14, as illustrated by the dashed arrows in FIG. 1 may be either reflected or lost to absorption. As illustrated, light may travel toward the submount around perimeter edges of the LED chip 12 as well as between the first and second contact pads 16, 18 and corresponding electrical traces 20-1, 20-2.

Figure 2:
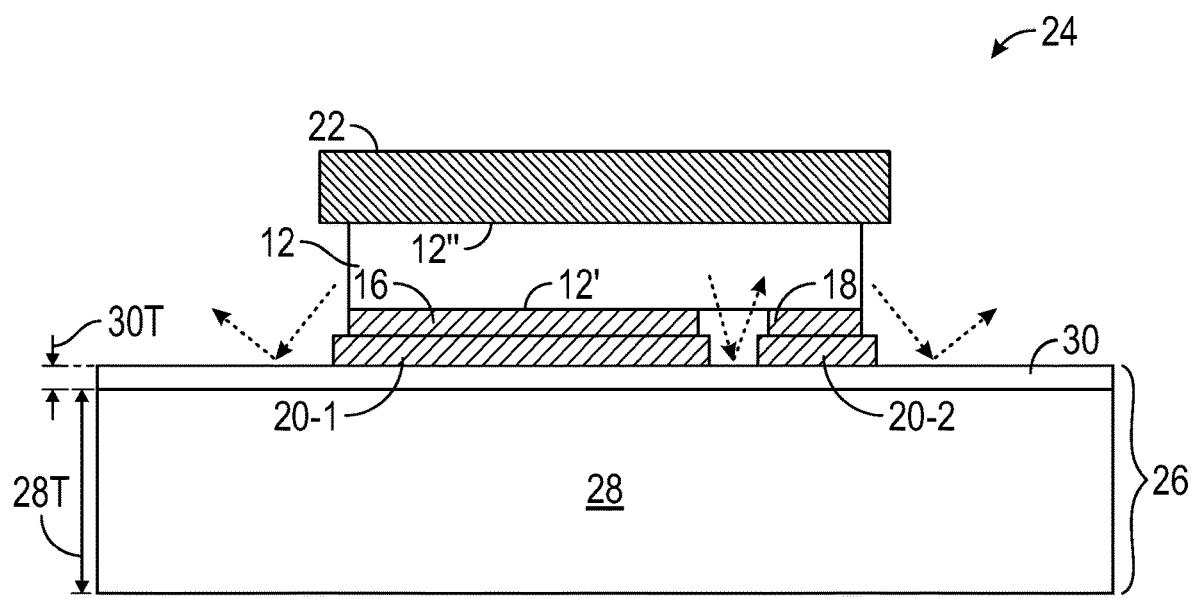
FIG. 2 is a cross-sectional illustration of an LED package where a submount includes a base and a ceramic layer arranged on the base according to embodiments disclosed herein.

FIG. 2 is a cross-sectional illustration of an LED package 24 where a submount 26 includes a base 28 and a ceramic layer 30 that is arranged on the base 28 according to embodiments disclosed herein. While a single LED chip 12 is illustrated, the LED package 24 may comprise a plurality of LED chips 12. In certain embodiments, and particularly for higher power applications, the submount 26 may be configured with high thermal conductivity to help dissipate heat generated by the LED chip 12. In particular, the base 28 of the submount 26 may comprise one or more materials having such high thermal conductivity. The base 28 may comprise a thermal conductivity of at least 100 watts per meter-kelvin (W/mK), or at least 150 W/mK, or at least 170 W/mK, or at least 200 W/mK or more. In certain embodiments, the base 28 is a ceramic base that comprises a ceramic material such as AlN, beryllium oxide (BeO), or SiC, among others. While providing sufficient thermal conductivity for high power applications, such ceramic materials generally have lower reflectivity in the visible spectrum and may accordingly absorb larger quantities of light within the LED package 24. In this regard, the ceramic layer 30 of the submount 26 may be configured with higher reflectivity in the visible spectrum than the base 28. As illustrated, the ceramic layer 30 may be provided on a surface of the base 28 such that the ceramic layer 30 is arranged between the LED chip 12 and the base 28. In certain embodiments, the base 28 comprises a first ceramic material and the ceramic layer 30 comprises a second ceramic material that is different than the first ceramic material, thereby providing differences in thermal conductivity and reflectivity between different portions of the submount 26. Accordingly, the submount 26 may be configured with higher thermal conductivity from the base 28 while also providing higher reflectivity from the ceramic layer 30. In this manner, the submount 26 may comprise a multilayer ceramic submount.

As illustrated, the electrical traces 20-1, 20-2 may be provided on the ceramic layer 30 such that the ceramic layer 30 is arranged between the base 28 and the electrical traces 20-1, 20-2. In such arrangements, more light may be reflected or otherwise redirected by the submount 26 along perimeter edges of the LED chip 12 as well as between the first and second contact pads 16, 18 and corresponding electrical traces 20-1, 20-2. The ceramic layer 30 may be arranged to cover an entire top surface of the base 28. In other embodiments, the ceramic layer 30 may be arranged to cover only a portion of the top surface of the base 28. For example, the ceramic layer 30 may be registered with light emission surfaces of the LED package 24 that are generally registered with one or more of the LED chip 12 and the lumiphoric material 22 while one or more perimeter edges of the base 28 may be uncovered by the ceramic layer 30.

In certain embodiments, the ceramic layer 30 comprises at least one of alumina and zirconia toughened alumina that is formed on the base 28. In certain embodiments, the ceramic layer 30 comprises an oxidized layer of titanium. The ceramic layer 30 may be formed by a deposition process such as sputtering on the base 28. In certain embodiments, the ceramic layer 30 may be formed on the base 28 by a sintering process. In embodiments where the ceramic layer 30 comprises an oxidized layer of titanium, a layer of titanium may be first deposited on the base 28, followed by oxidation. In other embodiments, the ceramic layer 30 may be separately provided as a preformed structure that is attached to the base 28 in any number of ways, including by way of an adhesive material. As such, the base 28 comprises the first ceramic material and the ceramic layer 30 comprises the second ceramic material that is different than the first ceramic material.

While providing sufficient reflectivity, the ceramic materials of the ceramic layer 30 may generally have lower thermal conductivity than the base 28. In particular, the ceramic layer 30 may comprise a thermal conductivity of 50 W/mK or less, or 40 W/mK or less. As such, the ceramic layer 30 may be arranged with a thickness 30T that is 10% or less than a thickness 28T of the base 28. In further embodiments, the thickness 30T of the ceramic layer 30 is 8% or less, or 5% or less, or 3% or less than the thickness 28T of the base 28. In still further embodiments, the thickness 30T of the ceramic layer 30 is 1% or less, or 0.5% or less, or 0.3% or less, or 0.1% or less than the thickness 28T of the base 28. In certain embodiments the thickness 28T of the base 28 is in a range including 300 microns (μm) to 2000 μm, or in a range including 375 μm to 1000 μm, or in a range including 500 μm to 1000 μm. In certain embodiments, the thickness 30T of the ceramic layer 30 is in a range including 1 μm to 30 μm, or in a range including 1 μm to 10 μm, or in a range including 1 μm to 5 μm, or in a range including 5 μm to 10 μm.

Figure 3:
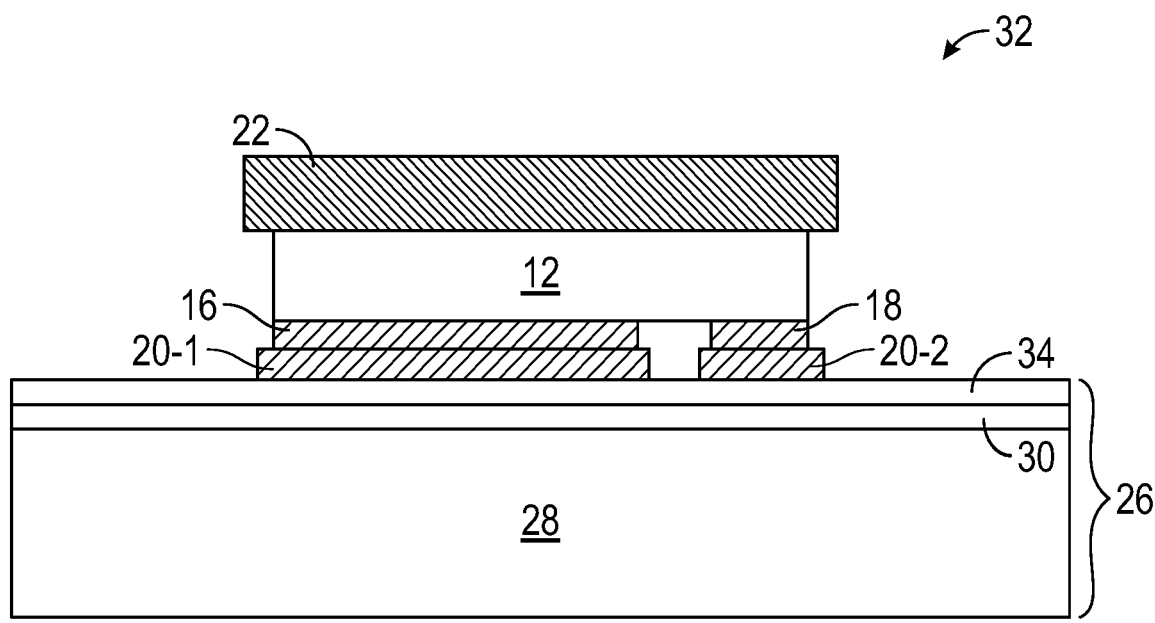
FIG. 3 is a cross-sectional illustration of an LED package where a submount includes one or more additional ceramic layers arranged between a plurality of electrical traces and a base according to embodiments disclosed herein.

FIG. 3 is a cross-sectional illustration of an LED package 32 where the submount 26 includes one or more additional ceramic layers 34 that are arranged between the plurality of electrical traces 20-1, 20-2 and the base 28 according to embodiments disclosed herein. In certain embodiments, the ceramic layers 30, 34 may comprise one or more combinations of alumina, zirconia toughened alumina, and an oxidized layer of titanium. For example, the ceramic layer 30 may comprise one of alumina, zirconia toughened alumina, and an oxidized layer of titanium while the additional ceramic layer 34 may comprise a different one of alumina, zirconia toughened alumina, and an oxidized layer of titanium. In certain embodiments, the ceramic layer 30 comprises alumina and the additional ceramic layer 34 comprises an oxidized layer of titanium. In other embodiments, the ceramic layer 30 comprises an oxidized layer of titanium and the additional ceramic layer 34 comprises alumina. The ceramic layers 30, 34 may be provided sequentially on the base 28 to form the submount 26. In certain embodiments, the LED package 32 may comprise a plurality of LED chips 12 on a common submount 26.

Figure 4:
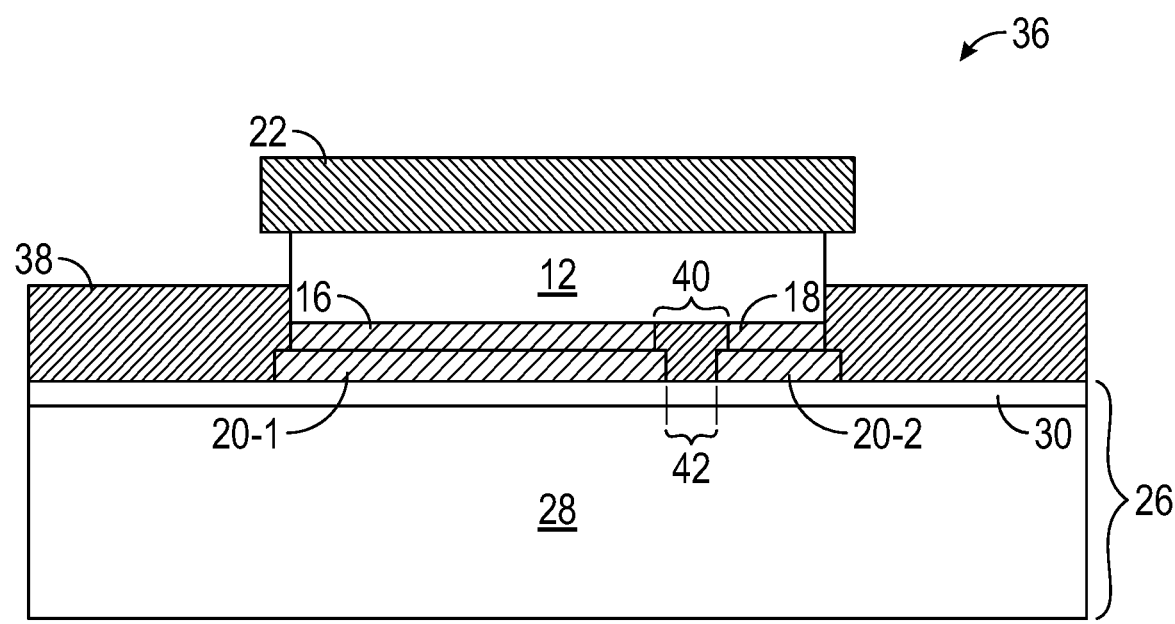
FIG. 4 is a cross-sectional illustration of an LED package where a light-altering material is provided around portions of a submount that are uncovered by an LED chip according to embodiments disclosed herein.

FIG. 4 is a cross-sectional illustration of an LED package 36 where a light-altering material 38 is provided around portions of the submount 26 that are uncovered by the LED chip 12 according to embodiments disclosed herein. The light-altering material 38 may be formed by a dispensing process after the LED chip 12 is mounted to the submount 26. In this manner, the light-altering material 38 may be formed around one or more perimeter edges or all perimeter edges of the LED chip 12. In certain embodiments, the light-altering material 38 comprises one or more light-reflective materials configured to provide additional reflection and redirection of light generated by the LED chip 12 or light that has interacted with the lumiphoric material 22. As illustrated, a gap 40 is formed by lateral spacings of the first and second contact pads 16, 18 and a gap 42 is formed by corresponding lateral spacings of the electrical traces

20-1, 20-2. If lateral dimensions of the gaps 40, 42 are large enough, some light-altering material 38 may wick or otherwise flow into the gaps 40, 42 during the dispensing process. If lateral dimensions of the gaps 40, 42 are small, such as 25 µm or less, or 10 µm or less, the light-altering material 38 may not wick or flow into the gaps 40, 42. As such, light that would otherwise travel through the gaps 40, 42 and be lost to absorption may be reflected by the ceramic layer 30. While a single ceramic layer 30 is illustrated in FIG. 4, one or more additional ceramic layers 34 may be provided as illustrated in FIG. 3. In certain embodiments, the LED package 36 may comprise a plurality of LED chips 12 on a common submount 26. In FIG. 4, the light-altering material 38 is illustrated as extending partially up a thickness of one or more perimeter edges of the LED chip 12. In other embodiments, the light-altering material 38 may extend an entire height or thickness of the LED chip 12.

Figure 5:
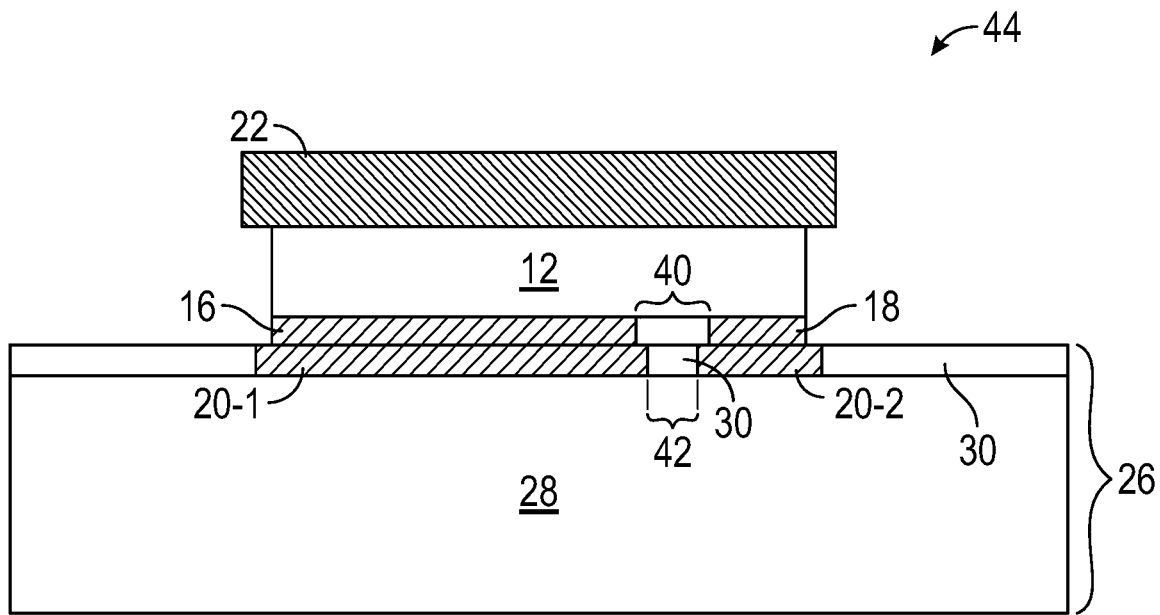
FIG. 5 is a cross-sectional illustration of an LED package where a plurality of electrical traces are at least partially embedded within a ceramic layer according to embodiments disclosed herein.

FIG. 5 is a cross-sectional illustration of an LED package 44 where the electrical traces 20-1, 20-2 are at least partially embedded within the ceramic layer 30 according to embodiments disclosed herein. As illustrated, the electrical traces 20-1, 20-2 are formed on the base 28, and the ceramic layer 30 may be provided along one or more portions of the base 28 that are uncovered by the electrical traces 20-1, 20-2. In this regard, the ceramic layer 30 may be formed after the electrical traces 20-1, 20-2 are provided. Upper surfaces of the electrical traces 20-1, 20-2 are uncovered by the ceramic layer 30 to facilitate electrical connections with the LED chip 12. In certain embodiments, one of the electrical traces 20-1, 20-2 forms an anode electrical trace and the other of the electrical traces 20-1, 20-2 forms a cathode electrical trace for electrical coupling with the LED chip 12. In certain embodiments, the gap 42 formed between such electrical traces 20-1, 20-2 may comprise the ceramic layer 30. The gap 42 may be formed with a lateral spacing of no more than 25 µm, or no more than 10 µm in certain embodiments. By providing the ceramic layer 30 in the gap 42 with such dimensions, the submount 26 may be provided with increased reflectivity. Additionally, the presence of the ceramic layer 30 in the gap 42 may provide electrical isolation between the electrical traces 20-1, 20-2 to prevent electrical shorting during bonding of the LED chip 12. In certain embodiments, top surfaces of the ceramic layer 30 and the electrical traces 20-1, 20-2 may be coplanar with one another.

Figure 6:
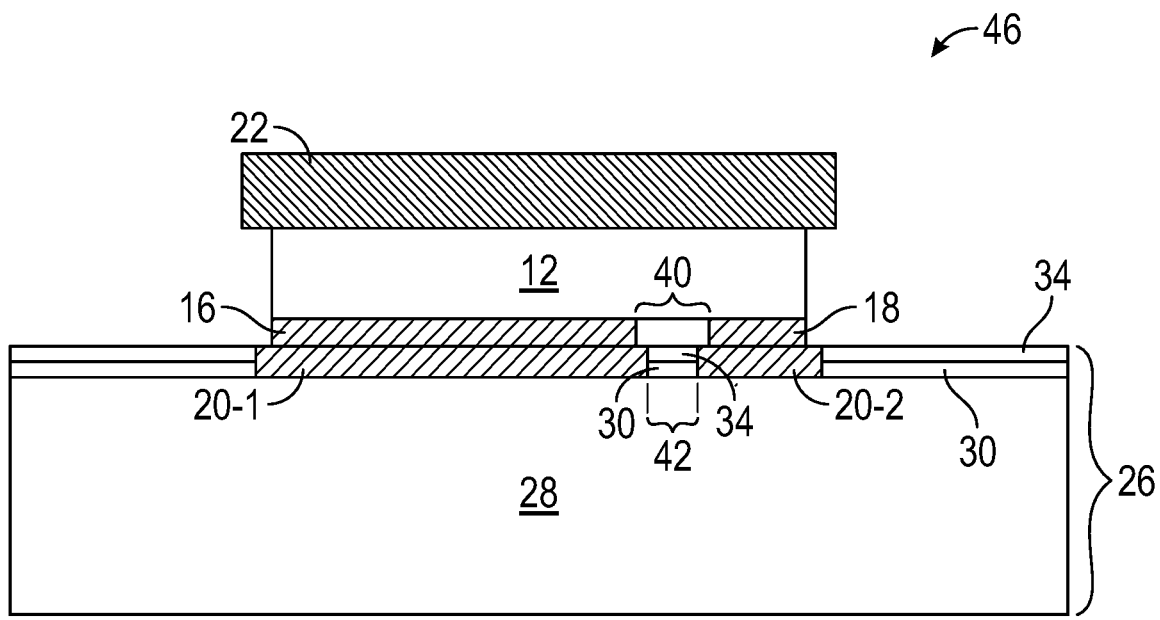
FIG. 6 is a cross-sectional illustration of an LED package where a plurality of electrical traces are at least partially embedded within one or more additional ceramic layers according to embodiments disclosed herein.

FIG. 6 is a cross-sectional illustration of an LED package 46 where the electrical traces 20-1, 20-2 are at least partially embedded within the one or more additional ceramic layers 34 according to embodiments disclosed herein. As illustrated, the submount 26 may include the additional ceramic layer 34 as described for FIG. 3. Accordingly, the electrical traces 20-1, 20-2 may be arranged to be at least partially embedded within multiple ceramic layers 30, 34 while leaving upper surfaces of the electrical traces 20-1, 20-2 uncovered by the ceramic layers 30, 34 to facilitate electrical connections with the LED chip 12. In this arrangement, the gap 42 may comprise the multiple ceramic layers 30, 34. In certain embodiments, top surfaces of the additional ceramic layer 34 and the electrical traces 20-1, 20-2 may be coplanar with one another.

Figure 7A:
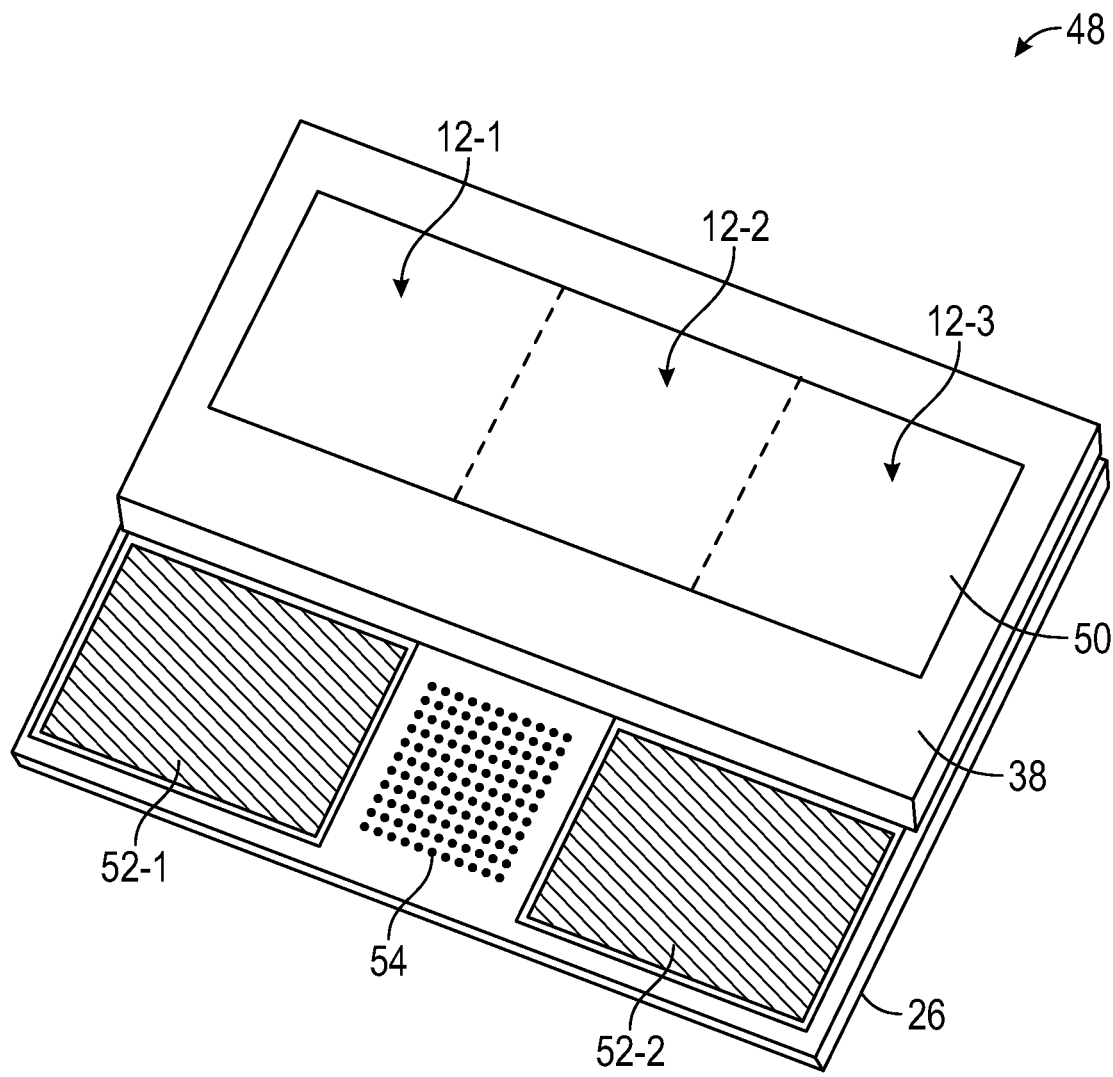
FIG. 7A is a perspective view of an LED package according to embodiments disclosed herein.

FIG. 7A is a perspective view of an LED package 48 according to embodiments disclosed herein. In certain embodiments, the LED package 48 is configured for high power and high light output applications, including but not limited to, exterior automotive lighting. For such applications, a plurality of LED chips 12-1 to 12-3 may be arranged in close proximity to one another on the submount 26 to provide a combined overall emission area for the LED package 48. In FIG. 7A, the plurality of LED chips 12-1 to 12-3 are arranged under a wavelength conversion element 50 that may at least partially obscure visibility. In this regard, the relative locations of the LED chips 12-1 to 12-3 are shown with dashed lines separating locations of individual ones of the LED chips 12-1 to 12-3 relative to the submount 26. While the LED package 48 is illustrated with three LED chips 12-1 to 12-3, any number of LED chips are possible. The LED package 48 includes package contacts 52-1, 52-2 on the submount 26 that form an anode contact and a cathode contact configured to receive an electrical connection from a power source external to the LED package 48. In certain embodiments, an identifier portion 54 of the submount 26 includes identification or other information about the LED package 48, including a quick response (QR) code, a bar code, or alphanumeric information. In FIG. 7A, the identifier portion 54 is illustrated between the package contacts 52-1, 52-2. In other embodiments, the identifier portion 54 may be located on other areas of the submount 26.

The LED package 48 may further include the light-altering material 38 that is arranged around a perimeter of the LED chips 12-1 to 12-3 on a surface of the submount 26. In certain embodiments, the light-altering material 38 is configured to redirect or reflect laterally-emitting light from the LED chips 12-1 to 12-3 toward a desired emission direction. In other embodiments, the light-altering material 38 may be configured to block or absorb at least a portion of any laterally-emitting light from the LED chips 12-1 to 12-3 that would otherwise escape the LED package 48 at wide emission angles. The light-altering material 38 may partially cover the submount 26 outside of where the LED chips 12-1 to 12-3 are located, while leaving other portions of the submount 26 uncovered so that the package contacts 52-1, 52-2 are externally accessible. The light-altering material 38 may form a cross-sectional profile comprising a planar top surface with vertical side surfaces or a curved top surface with vertical side surfaces. In other embodiments, the light-altering material 38 may form other shapes, including a planar or curved top surface with non-planar or non-vertical side surfaces. In certain embodiments, at least a portion of the light-altering material 38 may extend to one or more edges of the submount 26. In certain embodiments, the light-altering material 38 extends to three edges of the submount 26, but does not extend to a fourth edge of the submount 26, thereby providing external access to the package contacts 52-1, 52-2. The light-altering material 38 may also be arranged around one or more perimeter edges of the wavelength conversion element 50.

Figure 7B:
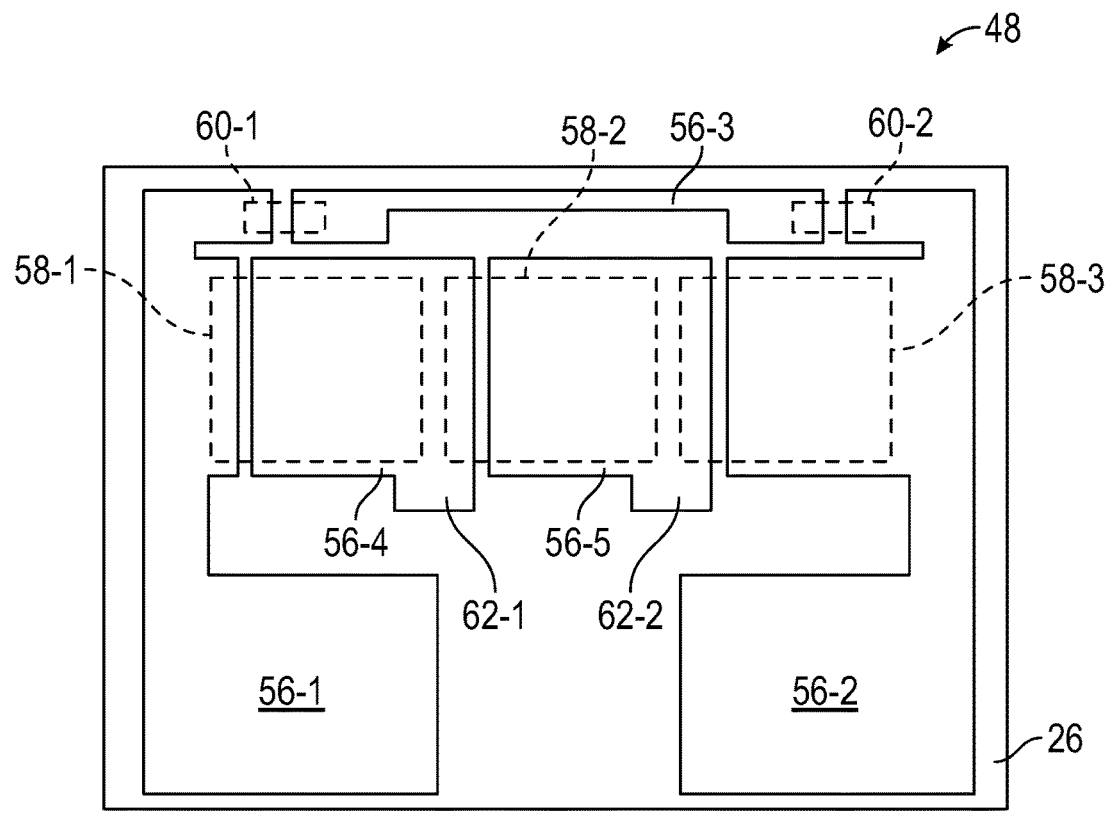
FIG. 7B illustrates a top view of the LED package of FIG. 7A in a partially assembled state.

FIG. 7B illustrates a top view of the LED package 48 of FIG. 7A in a partially assembled state. A plurality of electrical traces 56-1 to 56-5 are arranged on the submount 26, and each electrical trace 56-1 to 56-5 includes a continuous metal or electrically conductive material formed on a surface of the submount 26. As illustrated, each electrical trace 56-1 to 56-5 is discontinuous with one another. Certain pairs of the electrical traces 56-1 to 56-5 form a plurality of die attach pads 58-1 to 58-3, or a plurality of mounting areas, that are indicated by dashed-line boxes in FIG. 7B. The die attach pads 58-1 to 58-3 are configured to receive a plurality of LED chips. For example, the die attach pad 58-1 includes a portion of the electrical trace 56-1 and a portion of the electrical trace 56-4. Accordingly, an anode of an LED chip may be mounted or attached to the electrical trace 56-1 while a cathode of the same LED chip may be mounted or attached to the electrical trace 56-4. In a similar manner, the die attach pad 58-2 includes a portion of the electrical trace 56-4 and a portion of the electrical trace 56-5, and the die attach pad 58-3 includes a portion of the electrical trace 56-2 and a portion of the electrical trace 56-5. In certain embodiments, the LED package 48 may be comprise one or more electrostatic discharge (ESD) chips. In FIG. 7B, the electrical trace 56-3 forms portions of ESD attach pads 60-1, 60-2 with each of the electrical traces 56-1, 56-2, respectively. Certain electrical traces (e.g., 56-4, 56-5 in FIG. 7B) may form one or more test tabs 62-1, 62-2 that allow for individual testing of LED chips that are mounted to the die attach pads 58-1 to 58-3. As illustrated, the one or more test tabs 62-1, 62-2 are arranged outside of an area of the die attach pads 58-1 to 58-3. In this regard, the one or more test tabs 62-1, 62-2 are accessible after LED chips are mounted in the LED package 48. For applications where LED chips are arranged in close proximity to one another, the electrical traces 56-1 to 56-5 may be arranged with narrow gaps between one another on the submount 26, particularly in areas that are registered with the die attach pads 58-1 to 58-3.

Figure 7C:
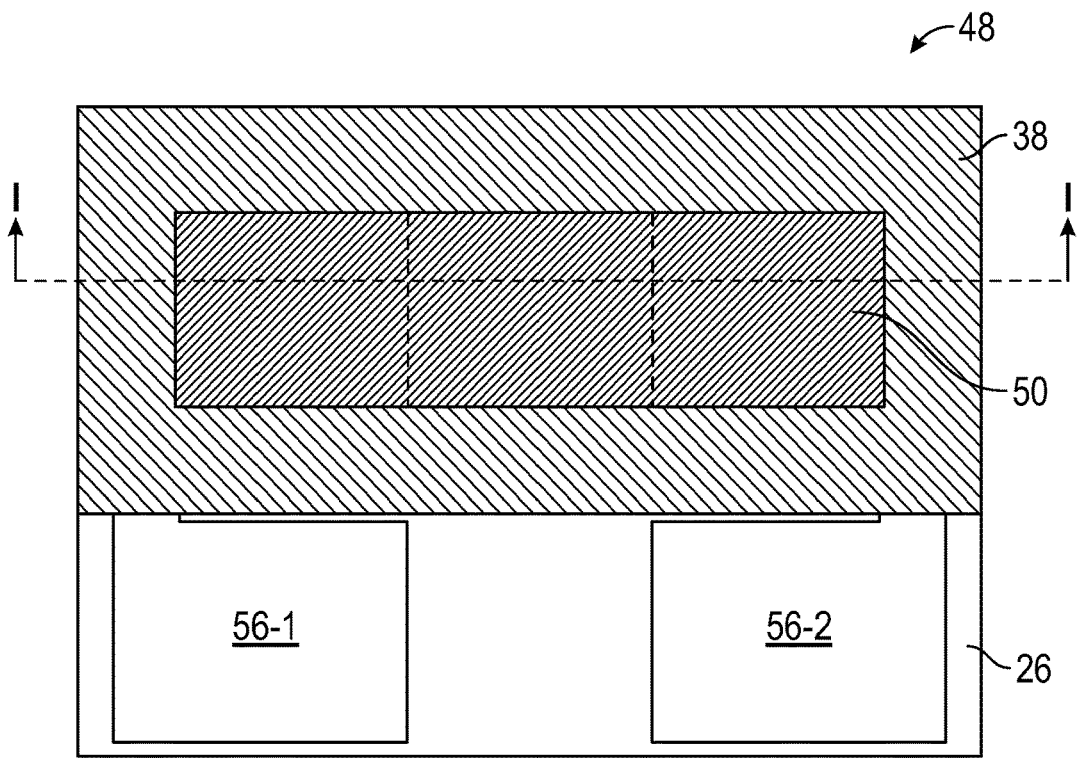
FIG. 7C is a top view of the LED package of FIG. 7B with addition of a light-altering material 38 and a wavelength conversion element according to embodiments disclosed herein.

FIG. 7C is a top view of the LED package 48 of FIG. 7B with addition of the light-altering material 38 and the wavelength conversion element 50 according to embodiments disclosed herein. As illustrated, the light-altering material 38 is provided on the submount 26 to laterally surround peripheral boundaries or edges of the wavelength conversion element 50 while also leaving at least a portion of each of the electrical traces 56-1, 56-2 uncovered. In this manner, the uncovered portions of the electrical traces 56-1, 56-2 form at least portions of the package contacts 52-1, 52-2 of FIG. 7A.

Figure 7D:
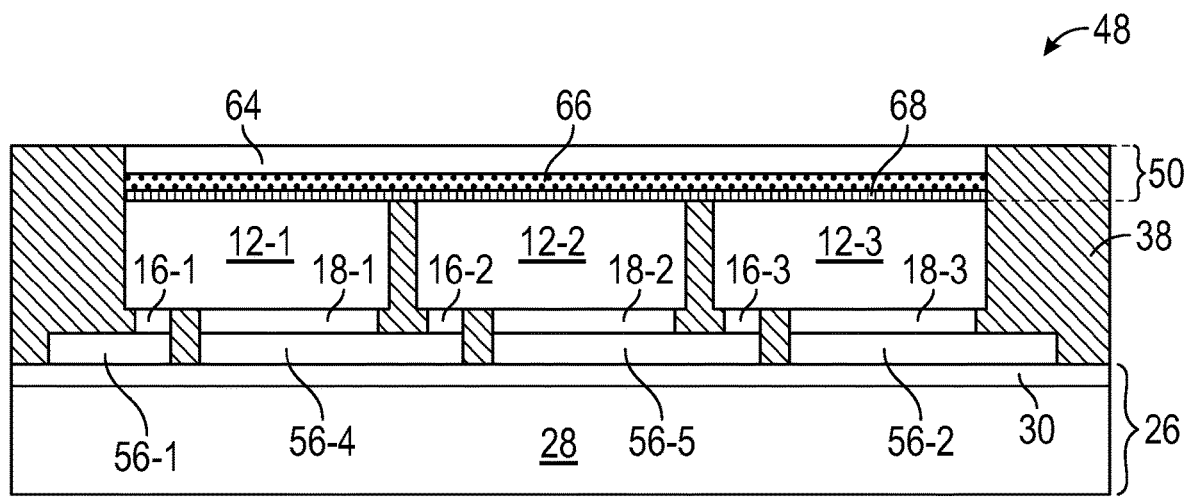
FIG. 7D is a cross-sectional view of the LED package of FIG. 7C taken along the sectional line I-I.

FIG. 7D is a cross-sectional view of the LED package 48 taken along the sectional line I-I of FIG. 7C. The wavelength conversion element 50 comprises a superstrate 64 that includes a lumiphoric material 66 disposed thereon. In certain embodiments, the superstrate 64 and the lumiphoric material 66 may be attached to the LED chips 12-1 to 12-3 using, for example, a layer of transparent adhesive 68. As illustrated, the light-altering material 38 may be arranged around a perimeter or peripheral edge of one or more of the LED chips 12-1 to 12-3 to redirect laterally emitting light in a desired emission direction of the LED package 48. The light-altering material 38 may also be arranged between the LED chips 12-1 to 12-3 and the submount 26 in various locations to provide further brightness improvements, including in gaps formed between various pairs of the electrical traces 56-1 to 56-5, and in gaps between a plurality of first contact pads 16-1 to 16-3 and a plurality of second contact pads 18-1 to 18-3 of corresponding LED chips 12-1 to 12-3. In certain embodiments, the light-altering material 38 may be arranged around a perimeter or peripheral edge of the wavelength conversion element 50 to redirect light from the lumiphoric material 66 from laterally escaping through the wavelength conversion element 50. In such arrangements, the light-altering material 38 and the wavelength conversion element 50 may provide improved operation and environmental protection of the LED package 48 in high power applications. For such applications, the LED chips 12-1 to 12-3 may be provided close to one another in a tightly packed arrangement. As such, the submount 26 may comprise the base 28 with a material having high thermal conductivity such as AlN. For light extraction improvements, the submount 26 may further comprise the ceramic layer 30 with a material having higher reflectivity arranged over the base 28, such as one or more of alumina, zirconia toughened alumina, and an oxidized layer of titanium as previously described. In certain embodiments, when the lateral spacing between the electrical traces 56-1 to 56-5 is small, such as less than 25 μm or less than 10 μm, the light-altering material 38 may not flow or wick to fill gaps between the electrical traces 56-1 to 56-5. The arrangement of the ceramic layer 30 of the submount 26 thereby provides improved reflectivity in such areas, while the base 28 provides improved thermal conductivity dissipating heat away from the LED chips 12-1 to 12-3. In certain embodiments, the LED chips 12-1 to 12-3 are electrically connected to one another in a series by the electrical traces 56-1 to 56-5. For example, the electrical trace 56-4 is configured to electrically connect with both the second contact pad 18-1 of the first LED chip 12-1 and the first contact pad 16-2 of the second LED chip 12-2. In other embodiments, the electrical traces 56-1 to 56-5 may be arranged to provide different electrical connections for the LED chips 12-1 to 12-3, including parallel arrangements and separately controllable arrangements where each of the LED chips 12-1 to 12-3 may be operated independently.

Figure 8:
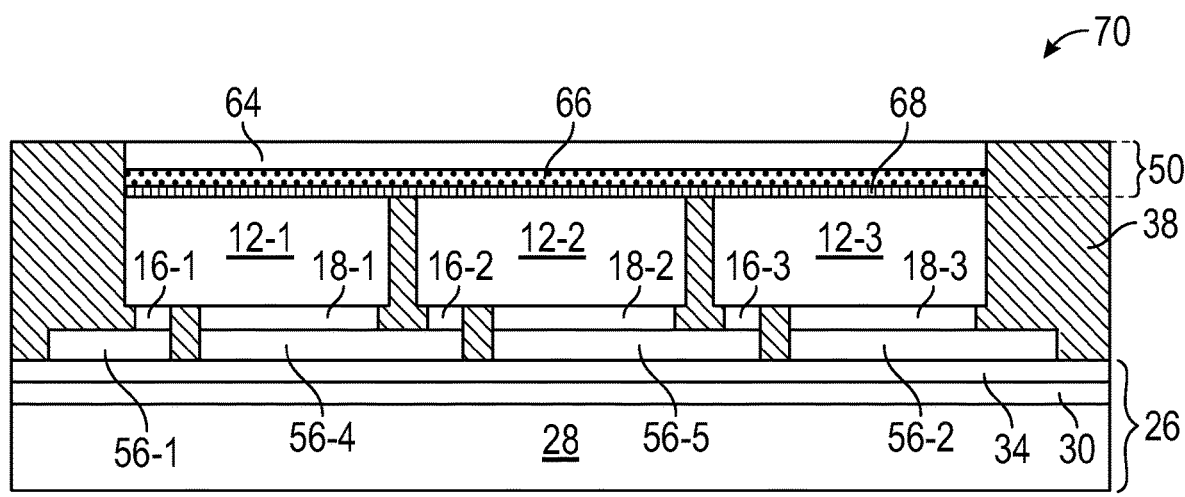
FIG. 8 is a cross-sectional view of an LED package that is similar to the LED package of FIG. 7D and further includes one or more additional ceramic layers in the submount.

FIG. 8 is a cross-sectional view of an LED package 70 that is similar to the LED package 48 of FIG. 7D and further includes the one or more additional ceramic layers 34 in the submount 26. As with previous embodiments, the ceramic layers 30, 34 may comprise one or more combinations of alumina, zirconia toughened alumina, and an oxidized layer of titanium. The ceramic layers 30, 34 may be provided sequentially on the base 28 to form the submount 26. In such an arrangement, the electrical traces 56-1 to 56-5 may be provided on the additional ceramic layer 34 and both of the ceramic layers 30, 34 are arranged between the LED chips 12-1 to 12-3 and the base 28. Accordingly, the one or more additional ceramic layers 34 may be configured to provide further improved reflectivity of the submount 26. The light-altering material 38 and the wavelength conversion element 50 may be arranged as previously described.

Figure 9:
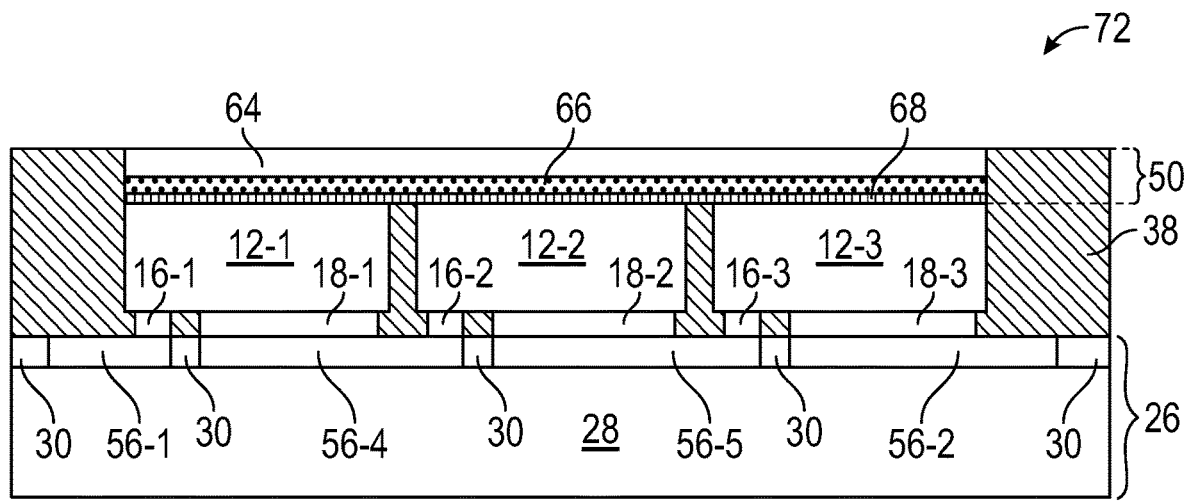
FIG. 9 is a cross-sectional view of an LED package that is similar to the LED package of FIG. 7D and where the plurality of electrical traces are at least partially embedded within the ceramic layer.

FIG. 9 is a cross-sectional view of an LED package 72 that is similar to the LED package 48 of FIG. 7D where the electrical traces 56-1 to 56-5 are at least partially embedded within the ceramic layer 30. In certain embodiments, top surfaces of the ceramic layer 30 and the electrical traces 56-1 to 56-5 may be coplanar with one another. The plurality of LED chips 12-1 to 12-3 may be mounted in close proximity to one another along the electrical traces 56-1 to 56-5 with the ceramic layer 30 providing improved reflectivity along portions of the base 28 that are uncovered by the electrical traces 56-1 to 56-5. In this arrangement, the ceramic layer 30 is provided in gaps between the electrical traces 56-1 to 56-5 that may otherwise be difficult to fill with reflective materials, particularly for spacings of 25 μm or less, or 10 μm or less. The light-altering material 38 and the wavelength conversion element 50 may be arranged as previously described.

Figure 10:
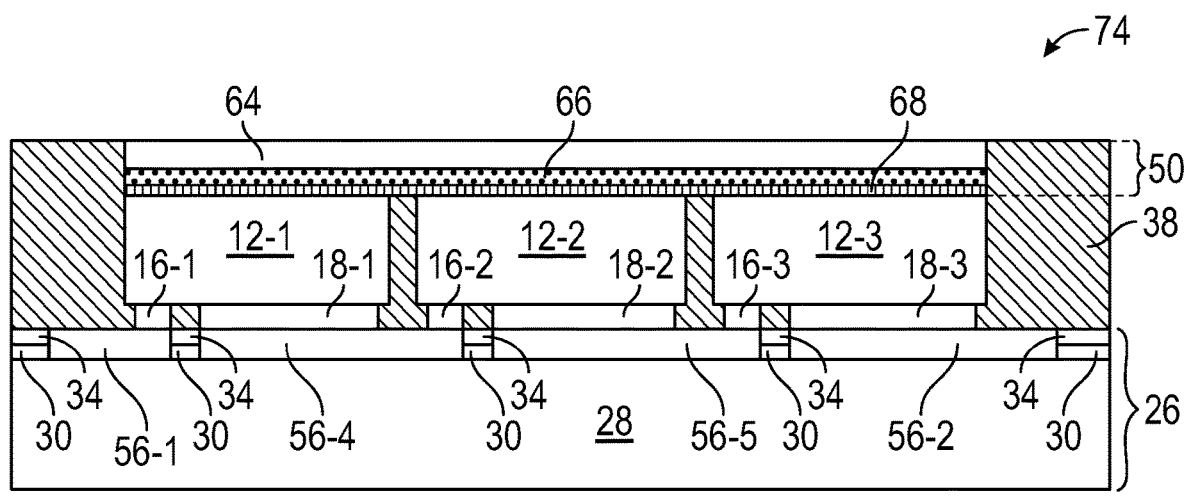
FIG. 10 is a cross-sectional view of an LED package that is similar to the LED package of FIG. 9 and further includes one or more additional ceramic layers between the plurality electrical traces.

FIG. 10 is a cross-sectional view of an LED package 74 that is similar to the LED package 72 of FIG. 9 and further includes the one or more additional ceramic layers 34 between the electrical traces 56-1 to 56-5. In this manner, the electrical traces 56-1 to 56-5 are at least partially embedded within the ceramic layers 30, 34 while leaving upper surfaces of the electrical traces 56-1 to 56-5 uncovered by the ceramic layers 30, 34 to facilitate electrical connections with the LED chips 12-1 to 12-3. In this arrangement, gaps formed between the electrical traces 56-1 to 56-5 may comprise multiple ceramic layers 30, 34 for improved reflectivity. In certain embodiments, top surfaces of the ceramic layer 34 and the electrical traces 56-1 to 56-5 may be coplanar with one another.

Figure 11A:
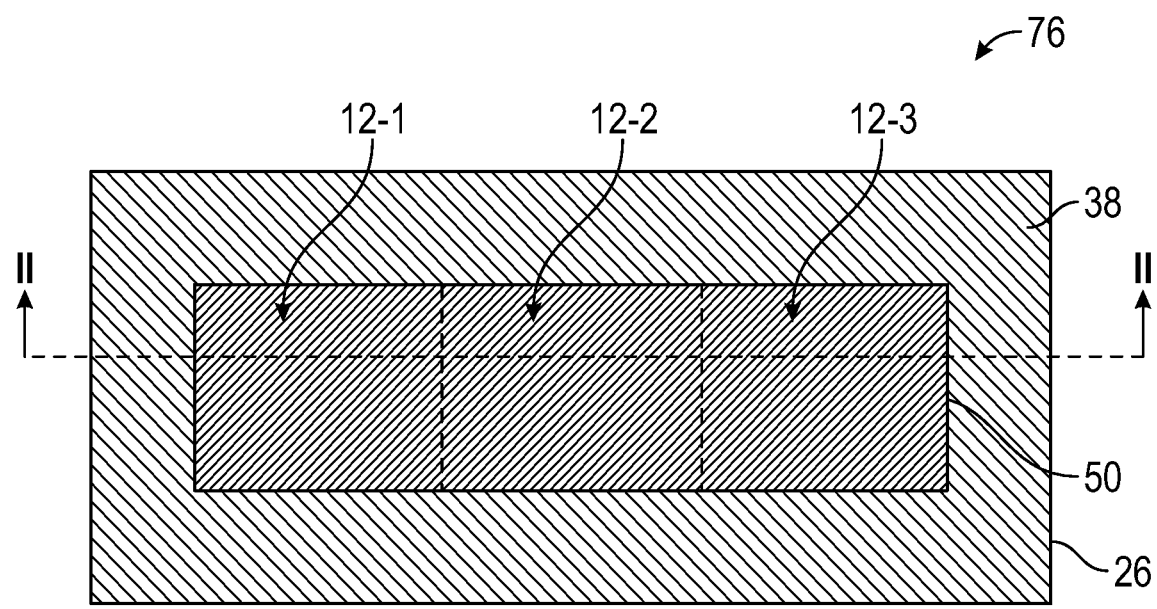
FIG. 11A is a top view of an LED package that is similar to the LED package of FIG. 7A and is further configured to receive external electrical connections from a bottom side of the LED package.

FIG. 11A is a top view of an LED package 76 that is similar to the LED package 48 of FIG. 7A and is further configured to receive external electrical connections from a bottom side of the LED package 76. In this regard the package contacts 52-1, 52-2 of FIG. 7A are not present on a top surface or face of the LED package 76 in FIG. 11A. As illustrated, the wavelength conversion element 50 is registered with locations of the LED chips 12-1 to 12-3, and the light-altering material 38 is arranged around peripheral edges of the wavelength conversion element 50. In certain embodiments, the light-altering material 38 is arranged to cover a majority of a top surface or face of the submount 26 that is outside of the LED chips 12-1 to 12-3. In certain embodiments, the light-altering material 38 is arranged to cover an entire top surface or face of the submount 26 that is outside of the LED chips 12-1 to 12-3.

Figure 11B:
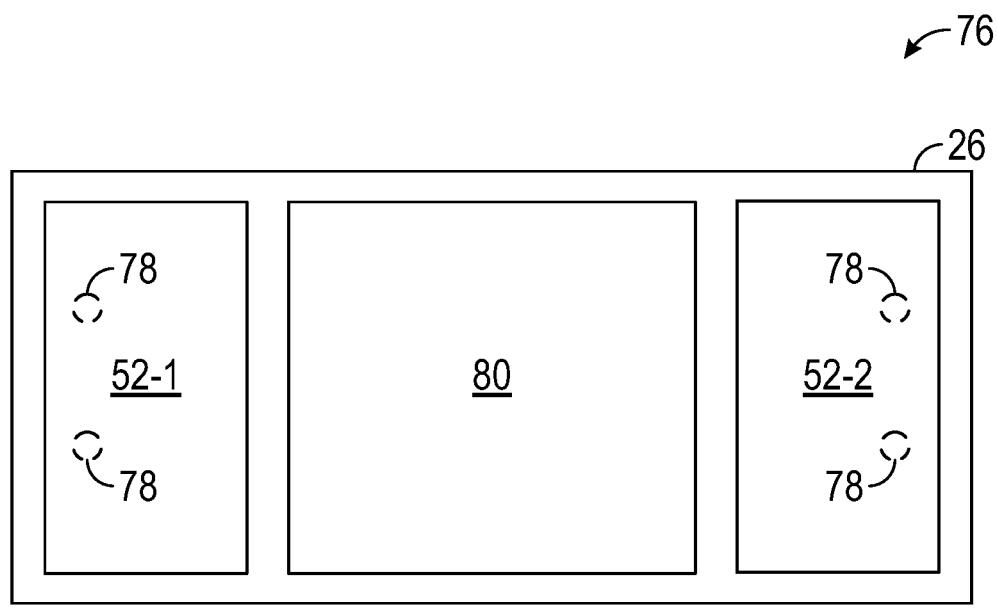
FIG. 11B is a backside or bottom view of the LED package of FIG. 11A.

FIG. 11B is a backside or bottom view of the LED package 76 of FIG. 11A. As illustrated, the package contacts 52-1, 52-2 are arranged on the backside of the submount 26, rather than the topside of the LED package 48 of FIG. 7A. In this manner, the backside of the submount 26 forms a package mounting face that is configured such that the LED package 76 may be mounted to another surface, such as a PCB, and electrical connections for the LED package 76 are provided by mounting the package contacts 52-1, 52-2 to corresponding electrical pads or traces. To facilitate electrical connections between the LED chips 12-1 to 12-3, one or more conductive vias 78 are arranged through the submount 26. In certain embodiments, the LED package 76 may further include a thermal pad 80 on the backside of the submount 26. In certain embodiments, the thermal pad 80 includes the same materials as the package contacts 52-1, 52-2. In other embodiments, the thermal pad 80 includes different materials. The thermal pad 80 may be electrically isolated from the package contacts 52-1, 52-2 and may be registered with one or more of the LED chips 12-1 to 12-3 of FIG. 11A to spread or dissipate heat during operation.

Figure 11C:
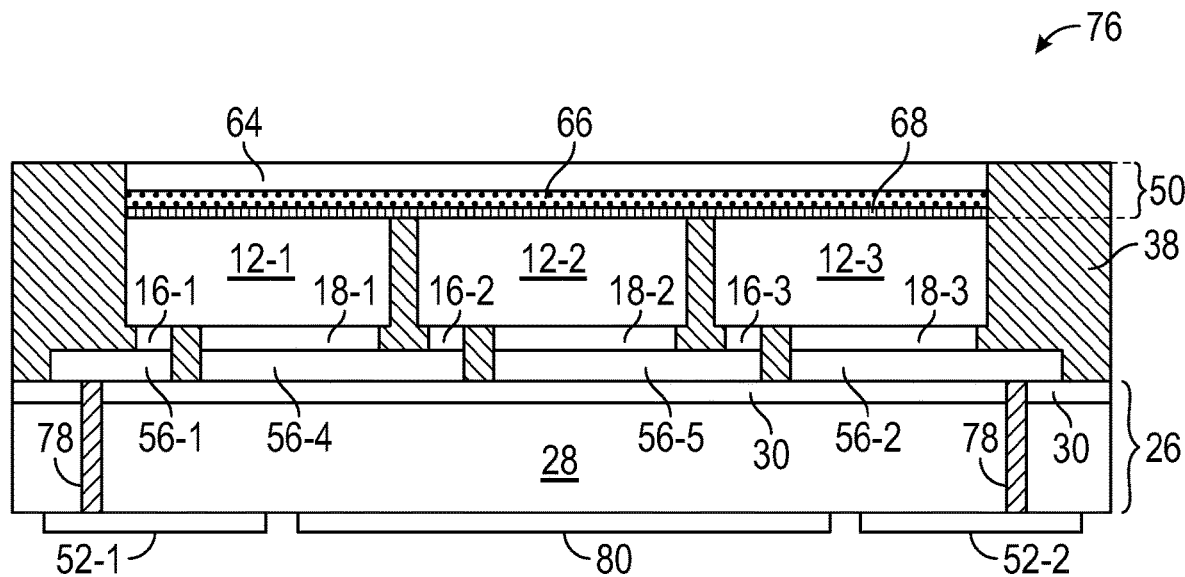
FIG. 11C is a cross-sectional view of the LED package of FIG. 11A taken along the sectional line II-II.

FIG. 11C is a cross-sectional view of the LED package 76 taken along the sectional line II-II of FIG. 11A. The wavelength conversion element 50 and the light-altering material 38 may be arranged as previously described. The one or more conductive vias 78 extend through the submount 26 to electrically connect one or more of the electrical traces 56-1 to 56-5 to the package contacts 52-1, 52-2. In FIG. 11C, at least one of the vias 78 is arranged to electrically connect the electrical trace 56-1 to the package contact 52-1 and at least one other of the vias 78 is arranged to electrically connect the electrical trace 56-2 to the package contact 52-2. In this manner, the one or more conductive vias 78 form portions of electrically conductive paths that extend through portions of the base 28 and the ceramic layer 30 in certain embodiments.

Figure 12:
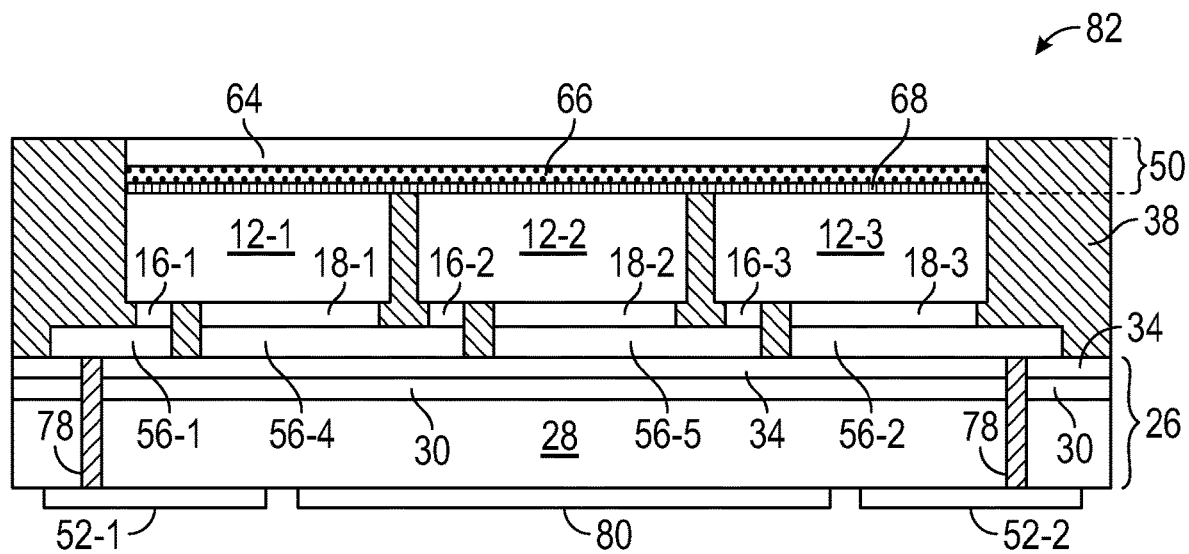
FIG. 12 is a cross-sectional view of an LED package that is similar to the LED package of FIG. 11C and further includes one or more additional ceramic layers.

FIG. 12 is a cross-sectional view of an LED package 82 that is similar to the LED package 76 of FIG. 11C and further includes the one or more additional ceramic layers 34 as previously described. In this manner, the one or more conductive vias 78 form portions of electrically conductive paths that extend through portions of the base 28 and multiple ceramic layers 30, 34 in certain embodiments.

Embodiments as disclosed herein are not limited to the previously described LED packages. In certain embodiments, LED packages may include additional reflective materials, encapsulants, lenses, optics, and lumiphoric materials on submounts as disclosed herein. In other embodiments, the base may be include other materials other than AlN, such as sapphire, SiC, silicone, and/or glass. In still other embodiments, submounts may include other materials, such as silicon, sapphire, SiC, silicone, and/or glass in addition to the base and ceramic layers as disclosed herein.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) package comprising:
    a submount comprising a ceramic base and a ceramic layer that is arranged on the ceramic base, wherein the ceramic base comprises a first ceramic material and the ceramic layer comprises a second ceramic material that is different than the first ceramic material;
    one or more electrical traces on a top surface of the ceramic layer; and
    at least one LED chip that is electrically connected to the one or more electrical traces, wherein portions of the ceramic layer form a top surface of the submount configured to reflect light from the at least one LED chip.

2. The LED package of claim 1, wherein the first ceramic material comprises aluminum nitride.

3. The LED package of claim 2, wherein the second ceramic material comprises alumina.

4. The LED package of claim 2, wherein the second ceramic material comprises zirconia toughened alumina.

5. The LED package of claim 1, wherein the second ceramic material comprises an oxidized layer of titanium.

6. The LED package of claim 1, wherein a thickness of the ceramic layer is in a range from 0.1% to 3% of a thickness of the ceramic base.

7. The LED package of claim 1, wherein a thermal conductivity of the ceramic base is at least 100 watts per meter-kelvin (W/mK) and a thermal conductivity of the ceramic layer is in a range from 50 W/mK to 40 W/mK.

8. The LED package of claim 1, further comprising one or more additional ceramic layers that are arranged between the one or more electrical traces and the ceramic base.

9. The LED package of claim 1, further comprising a light-altering material on the ceramic layer, wherein the light-altering material is arranged around a perimeter of the at least one LED chip.

10. The LED package of claim 9, further comprising a wavelength conversion element on the at least one LED chip, wherein the light-altering material is arranged around a perimeter of the wavelength conversion element.

11. The LED package of claim 1, wherein one or more electrically conductive paths are arranged through the ceramic layer and the ceramic base to electrically connect the at least one LED chip to one or more package contacts that are arranged on a backside of the submount.

12. A light-emitting diode (LED) package comprising:
    a submount comprising a ceramic base and a ceramic layer that is arranged on the ceramic base, wherein the ceramic base comprises a first ceramic material and the ceramic layer comprises a second ceramic material that is different than the first ceramic material;
    one or more electrical traces at least partially embedded in the ceramic layer, wherein a top surface of the one or more electrical traces is coplanar with a top surface of the ceramic layer; and at least one LED chip that is electrically connected to the one or more electrical traces at the top surface of the one or more electrical traces.

13. The LED package of claim 12, wherein the one or more electrical traces form an anode electrical trace and a cathode electrical trace for the at least one LED chip.

14. The LED package of claim 13, wherein the anode electrical trace and the cathode electrical trace are laterally spaced from each other by a gap of no more than 25 microns.

15. The LED package of claim 14, wherein the gap comprises a portion of the ceramic layer.

16. The LED package of claim 12, wherein the first ceramic material comprises aluminum nitride and the second ceramic material comprises alumina.

17. The LED package of claim 12, wherein the first ceramic material comprises aluminum nitride and the second ceramic material comprises zirconia toughened alumina.

18. The LED package of claim 12, wherein the first ceramic material comprises aluminum nitride and the second ceramic material comprises an oxidized layer of titanium.

19. The LED package of claim 12, wherein the one or more electrical traces are at least partially embedded in one or more additional ceramic layers.

20. A light-emitting diode (LED) package comprising:
a submount comprising a base material and an oxidized layer of titanium that is continuously arranged across at least a portion of the base material;
one or more electrical traces on the submount; and
at least one LED chip that is electrically connected to the one or more electrical traces.

21. The LED package of claim 20, wherein the base material comprises a ceramic base.

22. The LED package of claim 21, wherein the ceramic base comprises aluminum nitride.

23. The LED package of claim 20, wherein the base material comprises silicon.

24. The LED package of claim 20, wherein the one or more electrical traces are on the oxidized layer of titanium.

25. The LED package of claim 20, wherein the one or more electrical traces are at least partially embedded in the oxidized layer of titanium.

26. The LED package of claim 1, wherein a thickness of the ceramic layer is in a range from 0.1% to 10% of a thickness of the ceramic base.

* * * * *